United States Patent

Hartig et al.

[11] Patent Number: 5,344,718
[45] Date of Patent: Sep. 6, 1994

[54] HIGH PERFORMANCE, DURABLE, LOW-E GLASS

[75] Inventors: Klaus W. Hartig, Brighton; Philip J. Lingle, Lambertville, both of Mich.

[73] Assignee: Guardian Industries Corp., Northville, Mich.

[21] Appl. No.: 876,350

[22] Filed: Apr. 30, 1992

[51] Int. Cl.$^5$ .................. B32B 17/00; B32B 15/04
[52] U.S. Cl. .................... 428/623; 428/630; 428/622; 428/627; 359/360
[58] Field of Search .............. 428/614, 627, 630, 631, 428/668, 622, 623, 630, 627; 359/360

[56] References Cited

U.S. PATENT DOCUMENTS

| | | |
|---|---|---|
| 3,272,986 | 9/1966 | Schmidt . |
| 3,649,359 | 3/1972 | Apfel et al. . |
| 3,682,528 | 8/1972 | Apfel et al. . |
| 3,698,946 | 10/1972 | Kaspaul et al. . |
| 3,846,152 | 11/1974 | Franz . |
| 3,889,026 | 6/1975 | Groth . |
| 3,900,673 | 8/1975 | Mattimoe et al. . |
| 3,901,997 | 8/1975 | Groth . |
| 3,962,488 | 6/1976 | Gillery . |
| 3,978,273 | 8/1976 | Groth . |
| 3,990,784 | 11/1976 | Gelber . |
| 4,179,181 | 12/1979 | Chang . |
| 4,204,942 | 5/1980 | Chahroudi . |
| 4,335,166 | 6/1982 | Lizardo et al. . |
| 4,337,990 | 7/1982 | Fan et al. . |
| 4,356,073 | 10/1982 | McKelvey . |
| 4,422,916 | 12/1983 | McKelvey . |
| 4,488,775 | 12/1984 | Yamamoto . |
| 4,556,277 | 12/1985 | Fan et al. . |
| 4,639,069 | 1/1987 | Yatabe et al. . |
| 4,716,086 | 12/1987 | Gillery et al. . |
| 4,780,372 | 10/1988 | Tracy et al. ............. 428/428 |
| 4,799,745 | 1/1989 | Meyer et al. . |

FOREIGN PATENT DOCUMENTS

| | | |
|---|---|---|
| 031278 | 12/1980 | European Pat. Off. . |
| 0080182 | 6/1983 | European Pat. Off. . |
| 2027223 | 2/1980 | United Kingdom ............. 359/360 |

OTHER PUBLICATIONS

Airco Coating Technology, Super-E III, Jan. 1991, pp. 1-22.
Knittl, Zdenek, "Optics of Thin Films", John Wiley & Sons, Ltd., London, 1976, p. 284.

Primary Examiner—Benjamin R. Fuller
Assistant Examiner—Valerie Ann Lund
Attorney, Agent, or Firm—Geoffrey R. Myers

[57] ABSTRACT

A high performance, durable, low-E glass exhibiting about 80% or more visible transmittance, a hemispherical emissivity ($E_h$) of about 0.13 or less, and a normal emissivity ($E_n$) of about 0.10 or less is formed by sputter-coating a layer system on the glass substrate which comprises an undercoat and overcoat of $Si_3N_4$, at least one silver layer, and at least two sandwiching layers of a nickel or nickel alloy, preferably with the nickel alloy being nichrome, and the chromium being in the form of a nitride thereof.

21 Claims, 1 Drawing Sheet

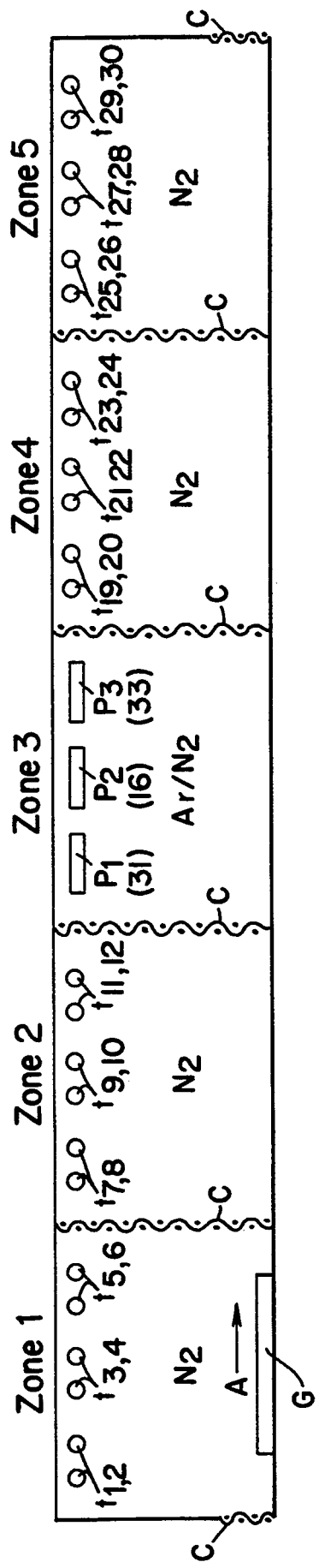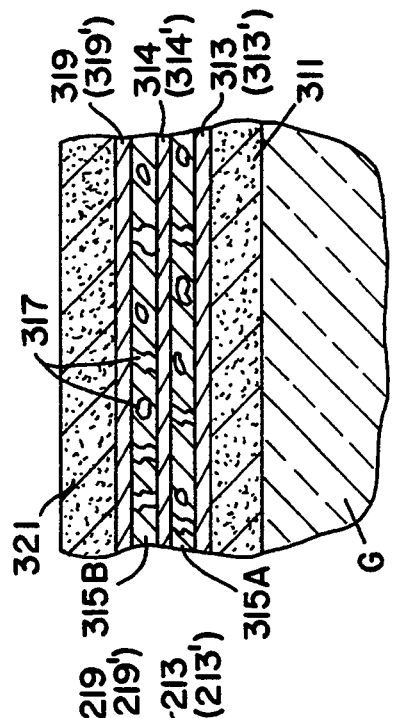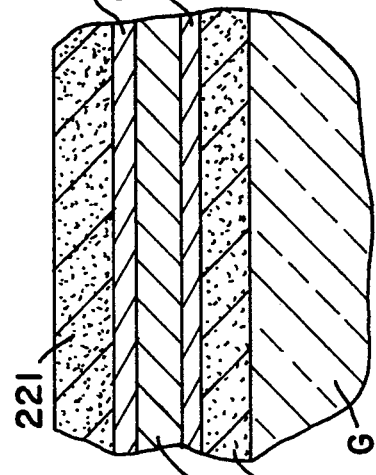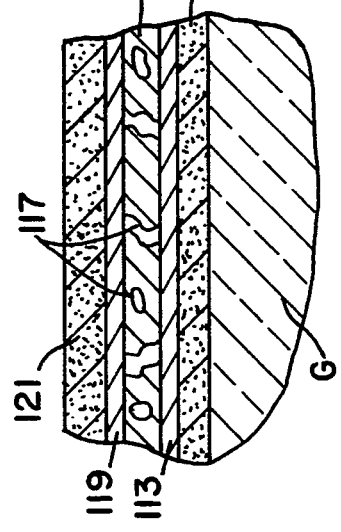

HIGH PERFORMANCE, DURABLE, LOW-E GLASS

FIELD OF THE INVENTION

This invention relates to sputter-coated glasses and methods for making them. More particularly, this invention relates to sputter-coated glasses exhibiting high visible light transmittance and excellent infrared energy reflecting characteristics useful as architectural glasses, and certain unique methods for making them.

BACKGROUND OF THE INVENTION

For architectural flat glass, such as is made by the "float" process, two of the more prominent techniques for creating solar management coatings on these glasses are the pyrolytic process and the magnetron sputter-coating process. Drawbacks heretofore experienced in the sputter-coating process have been that the coatings can often be easily rubbed off (i.e. lack "durability") and that the polysealant used in forming multi-paned architectural windows often attacks the coating. This, in turn, breaks down the seal between the panes, allowing detrimental condensation to accumulate between them. On the other hand, sputter coatings have had the historic advantage of being able to achieve low emissivity values and high visible light transmittance properties, as compared to most pyrolytic coatings. These latter two properties are perhaps among the most important to achieve in certain architectural glasses.

The terms "emissivity" and "transmittance" are well understood in the art and are used herein according to their well known meaning. Thus, for example, the term "transmittance" herein means solar transmittance, which is made up of visible light transmittance, infrared energy transmittance, and ultraviolet light transmittance. Total solar energy transmittance is then usually characterized as a weighted average of these other values. With respect to these transmittances, visible transmittance, as reported herein, is characterized by the standard Illuminant C technique at 380–720 nm; infrared is 800–2100 nm; ultraviolet is 300–400 nm; and total solar is 300–2100 nm. For purposes of emissivity, however, a particular infrared range (i.e. 2,500–40,000 nm) is employed, as discussed below.

Visible transmittance can be measured using known, conventional techniques. For example, by using a spectrophotometer, such as a Beckman 5240 (Beckman Sci. Inst. Corp.), a spectral curve of transmission at each wavelength is obtained. Visible transmission is then calculated using ASTM E-308 "Method for Computing the Colors of Objects by Using the CIE System" (Annual Book of ASTM Standards, Vol. 14.02). A lesser number of wavelength points may be employed than prescribed, if desired. Another technique for measuring visible transmittance is to employ a spectrometer such as a commercially available Spectragard spectrophotometer manufactured by Pacific Scientific Corporation. This device measures and reports visible transmittance directly.

"Emissivity" (E) is a measure, or characteristic of both absorption and reflectance of light at given wavelengths. It is usually represented by the formula:

$$E = 1 - Reflectance_{film}$$

For architectural purposes, emissivity values become quite important in the so-called "mid range", sometimes also called the "far range" of the infrared spectrum, i.e. about 2500–40,000 nm. The term "emissivity" as used herein, is thus used to refer to emissivity values measured in this infrared range as specified by the 1991 Proposed ASTM Standard for measuring infrared energy to calculate emittance, as proposed by the Primary Glass Manufacturers' Council and entitled "Test Method for Measuring and Calculating Emittance of Architectural Flat Glass Products Using Radiometric Measurements". This Standard, and its provisions, are incorporated herein by reference. In this Standard, emissivity is broken into two components, hemispherical emissivity ($E_h$) and normal emissivity ($E_n$).

The actual accumulation of data for measurement of such emissivity values is conventional and may be done by using, for example, a Beckman Model 4260 spectrophotometer with "VW" attachment (Beckman Scientific Inst. Corp.). This spectrophotometer measures reflectance versus wavelength, and from this, emissivity is calculated using the aforesaid 1991 Proposed ASTM Standard which has been incorporated herein by reference.

Another term employed herein is "sheet resistance". Sheet resistance ($R_s$) is a well known term in the art and is used herein in accordance with its well known meaning. Generally speaking, this term refers to the resistance in ohms for any square of a layer system on a glass substrate to an electric current passed through the layer system. Sheet resistance is an indication of how well the layer is reflecting infrared energy, and is thus often used along with emissivity as a measure of this characteristic, so important in many architectural glasses. "Sheet resistance" is conveniently measured by using a 4-point probe ohmmeter, such as a dispensable 4-point resistivity probe with a Magnetron Instruments Corp. head, Model M-800 produced by Signatone Corp. of Santa Clara, Calif.

As stated above, for many architectrual purposes it is desirable to have as low an emissivity and $R_s$ value as feasible, such that the glass window is reflecting substantial amounts of the infrared energy impinging on the glass. Generally speaking, "low-E" (i.e. low emissivity) glasses are considered to be those glasses which have a hemispherical emissivity ($E_h$) of less than about 0.16 and a normal emissivity ($E_n$) of less than about 0.12. Preferably, $E_h$ is about 0.13 or less, and $E_n$ is about 0.10 or less. At the same time, sheet resistance ($R_s$) is, therefore, preferably less than about 10.5 ohms/$square$. Such glasses, to be commercially acceptable, usually are required to transmit as much visible light as possible, often about 76% or more using the Illuminant C technique for measuring transmittance in glasses of about 2 mm–6 mm thick. Visible transmittance, in this respect, should more preferably be at least about 78% or greater for glasses between about 2 mm–6 mm thick. Even more preferably, visible transmittance should be about 80% or greater, and still most preferably, greater than about 80%.

The technique of creating architectural glass by magnetron sputter-coating multiple layers of metal and/or metal oxides or nitrides onto float glass sheets is well known and a large number of permutations and combinations of known metals (e.g. Ag, Au, etc.), oxides and nitrides have been attempted and reported. Such techniques may employ either planar or tubular targets, or a combination of both, in multi-target zones to achieve their desired results. Exemplary of preferred apparatus for use in this invention, and known in the art, is a magnetron sputter-coater sold by Airco Corporation. This commercially available device is disclosed in U.S. Pat. Nos. 4,356,073 and 4,422,916, respectively. The disclosures of these patents are incorporated herein by reference.

In particular, it has been known to use the aforesaid Airco sputter-coater to produce architectural glasses having a layering system, sequentially from the glass (e.g. standard float glass) outwardly, as follows:

$Si_3N_4/Ni:Cr/Ag/Ni:Cr/Si_3N_4$ in which it has been found in practice that the Ni:Cr alloy is 80/20 by weight Ni/Cr, respectively (i.e. nichrome), and wherein the two nichrome layers are reported as being 7 Å thick, the Ag layer is specified as being only about 70 Å thick [except that it is stated that the silver may be about 100 Å thick], and the $Si_3N_4$ layers are relatively thicker (e.g. 320 Å for the undercoat and about 450 Å for the overcoat). In reality, because of its thinness (i.e. about 70 Å), the silver (Ag) layer has been found, in practice, to actually be rather semi-continuous in nature.

FIG. 1 (explained more fully below) schematically illustrates a typical Airco sputter-coater as referenced above, used to produce this known Airco product. With reference to FIG. 1, Zones 1, 2, 4 and 5 are made up of silicon (Si) tubular targets ("t") and sputtering is conducted in a 100% $N_2$ atmosphere. Zone 3 typically employs planar targets "P" and is used to create the three intermediate layers, i.e. Ni:Cr/Ag/Ni:Cr. A 100% argon atmosphere is employed. It was believed, and heretofore has historically been believed in the sputter-coating art, that $N_2$ adversely affects silver during sputter-coating, and thus care was used to keep Zone 3 substantially free of $N_2$.

While this coating achieved good "durability" (i.e. the coating was scratch resistant, wear resistant and chemically stable) and thus achieved an important measure of this characteristic as compared to pyrolytic coatings, its other characteristics, in practice, have been found to fall short of the levels of infrared reflectance and visible transmittance characteristics normally desired for low-E architectural glasses. For example, for glass at about 3 mm thick, visible transmittance (Ill. C) is usually only about 76%, $E_h$ is about 0.20–0.22, and $E_n$ is about 0.14–0.17. Both of these emissivity values are rather high. In addition, sheet resistance ($R_s$) measures a relatively high 15.8 ohms/$_{sq.}$ (the more acceptable value being about 10.5 or less). Thus, while durability was significantly improved and while these coatings also proved to be compatible with conventional sealants (thus overcoming this problem in the multi-pane window art which normally required "edge deletion" and is now no longer required), solar management qualities were less than optimal for many modern architectural purposes.

In addition to this Airco layer system, other coatings containing silver and/or Ni:Cr as layers for infrared reflectance and other light management purposes have been reported in the patent and scientific literature. See, for example, the Fabry-Perot filters and other prior art coatings and techniques disclosed in U.S. Pat. Nos. 3,682,528 and 4,799,745 (and the prior art discussed and/or cited therein). See also the dielectric, metal sandwiches created in numerous patents including, for example, U.S. Pat. Nos. 4,179,181; 3,698,946; 3,978,273; 3,901,997; and 3,889,026 just to name a few. While such other coatings have been known or reported, it is believed that prior to our invention, none of these prior art disclosures teach or have achieved the ability to employ the highly productive sputter-coating process and, at the same time, achieve an architectural glass which not only approaches or equals the durability of pyrolytic coatings, but which also achieves excellent solar management qualities as well.

It is to be further stated that while the basic Airco apparatus and basic method of operation have been found to be quite acceptable, its productivity was found lacking. The reason for this lowered productivity is related to the assumption, which we have found to be inapplicable to our invention, that silver had to be isolated from $N_2$ gas during sputtering.

In view of the above, it is apparent that there exists a need in the art for a sputter-coated layer system which approaches or equals the durability of pyrolytic coatings, but which also achieves optimal solar management characteristics, thereby overcoming the problem normally attendant the pyrolytic method. As used herein, the terms "durable" or "durability" are used in accordance with their well known meanings in the art, and reflect, in this respect, a mechanical and chemical resistance to deterioration approaching or equalling that achieved by the pyrolytic process. It is also apparent from the above that there exists a need in the art for a coating created by magnetron sputter-coating which improves upon the transmittance, emissivity and, preferably, also the sheet resistance of those coatings obtained under the Airco process as above-described, as well as improving upon the productivity of this known process.

It is a purpose of this invention to fulfill the above needs, as well as other needs in the art which will become more apparent to the skilled artisan once given the following disclosure.

SUMMARY OF THE INVENTION

Generally speaking, this invention fulfills the above-described needs in the art by providing a sputter-coated glass article comprising a glass substrate having thereon, from the glass outwardly, a layer system comprising: an undercoat layer of $Si_3N_4$, a first layer of nickel or nickel alloy, a layer of silver, a second layer of nickel or nickel alloy, and an overcoat layer of $Si_3N_4$, and wherein when the glass substrate has a thickness of about 2 mm–6 mm, the coated glass preferably has a visible transmittance of at least about 78% (Ill. C), a normal emissivity ($E_n$) of less than about 0.12, and a hemispherical emissivity ($E_h$) of less than about 0.16.

In certain particularly preferred embodiments the layer systems are "durable" and visible transmittance, as aforesaid, is at least about 80% or greater, and most preferably, is greater than 80%. In still further preferred embodiments, the emissivity values are about 0.13 or less for $E_h$ and about 0.10 or less for $E_n$. Most preferred are $E_h$'s of about 0.12–0.13 and $E_n$'s of about 0.09–0.10. In these embodiments the preferred range for sheet resistance is preferably 10.5 ohms/$_{sq.}$ or less, and most preferably, about 9–10 ohms/$_{sq.}$.

In certain further preferred embodiments of this invention the layer system consists of the above five layers and no others. In other preferred embodiments the layer system may be augmented by other known coatings which do not interfere or disturb the essential qualities of the coatings of this invention. In certain instances, these additional layers may actually enhance the essential qualities of the coatings. One such other layer system as contemplated by this invention, for example, consists essentially of a seven-layer system created by severing the silver layer into two silver layers with a nickel-based (e.g. nickel-chrome) layer in between, such that the layer system from the glass outwardly now consists essentially of:

$Si_3N_4/Ni{:}Cr/Ag/Ni{:}Cr/Ag/Ni{:}Cr/Si_3N_4$

This seven-layered system is believed to exhibit, in general, somewhat higher durability and scratch resistance characteristics as compared to the above-described five-layered system, as well as an even higher infrared reflectance.

Further layers could, at times, include optional overcoats for further scratch resistance, or undercoats for adhesive purposes and the like. However, in the practice of this invention, the most preferred systems are the five and seven-layer systems set forth above.

It has been found in the practice of this invention that, in the preferred embodiments, and in order to achieve the desired optimal emissivity and transmittance characteristics desired, the thicknesses of the various layers are reasonably important to obtaining the desired ultimate results. In this respect, and in comparison to the known Airco five-layer system described above, it has been found important to employ an increased thickness of silver beyond the Airco prescribed 70 Å, on the order of about 20%–30% more, to insure, when the silver is a single layer, a substantially continuous silver layer and in all instances, to insure proper infrared reflectance properties. Thus, for this invention, rather than employing the prescribed Airco 70 Å silver layer, a total thickness of silver of about 90–105 Å and preferably about 95–105 Å is employed.

For the five-layered system of this invention, e.g. having a single Ag layer, about 95 Å is preferred for its thickness. In those embodiments where the silver layer is severed into two layers with a nickel-based layer between them, the total thickness of both should be about 90–105 Å, and preferably each should be about 50 Å. In this respect, it is to be noted that at 50 Å the silver layers become somewhat discontinuous. Despite this condition, which is a problem in the Airco system, no adverse affects arise therefrom in the practice of this invention.

The nickel-based layers employed are preferably the same Ni:Cr (80/20) nichrome employed in the Airco system. However, instead of using Airco's prescribed 10 Å (or greater) thickness, the Ni:Cr layers are usually kept below about 7 Å (e.g. about 6 Å or less, or a decrease of about 15–20%).

In a like manner to the total silver layer(s) employed, each of the $Si_3N_4$ layers of this invention are increased over those of the Airco system. In the preferred embodiments the increase is on the same order of magnitude as the silver increase, e.g. about 20% or greater. Thus, in the preferred embodiments, instead of using an undercoat and overcoat of $Si_3N_4$, each in a thickness of about 320 Å and 450 Å, respectively, as Airco prescribes (the undercoat being somewhat thinner than the overcoat), in the practice of this invention an undercoat thickness of $Si_3N_4$ of at least about 400 Å and an overcoat thickness of at least about 540 Å is preferred. Most preferred is an undercoat of about 400 Å–425 Å and an overcoat of about 540 Å–575Å. The purpose of these layers of $Si_3N_4$ is primarily for antireflection, color control, chemical resistance, scratch resistance and wear resistance.

Multi-pane windows are popular for architectural use. The layer systems of this invention have been found to be quite compatible with the conventional sealants used in making these windows, and thus overcomes this problem in the art (as above-described) to the same degree that the Airco layer system overcame this problem. Thus, in the preferred embodiments of this invention, "edge deletion" is not required.

Flying directly in the face of beliefs heretofore held in the art is the finding of this invention that, for certain preferred layer systems contemplated herein, it is not only unnecessary to isolate the silver from $N_2$ during sputtering, but it is advantageous to conduct both silver and nickel-based sputtering together in such an environment. No substantial loss of Ag performance, in this respect, has been found to occur. This, in turn, has led to the unexpected finding that if the nickel-based layer contains chromium and that chromium is converted into a nitride during sputtering, enhancement of transmittance properties surprisingly occurs. Thus, in certain preferred embodiments of this invention, the Ni-based target is a Ni:Cr alloy and the Cr during sputtering is converted (at least in part) to a nitride of Cr in the same sputter zone with the silver. This, as stated, has been found to enhance visible transmittance significantly in the ultimate product. In addition, by producing this nitride in the same zone that silver Sputter occurs, expense is decreased and productivity is increased.

Improved productivity and decreased costs, compared to the Airco process, are experienced in this way: In the Airco process (and others), sputtering of Si is difficult and slow because power to the targets (e.g. the tubular targets in the Airco process) must be increased, usually to the limit of the equipment, because the atmosphere used is 100% $N_2$. Under the assumption that silver must not be sputtered in an $N_2$-containing environment, and if one wished to convert the Cr to a nitride, the Ni:Cr targets would have to be put in separate zones, thus creating additional expense. The alternative would be to sputter these targets in the same $N_2$-containing zones as the Si, but this would slow production by decreasing the number of Si targets available for use. The finding that, in the practice of this invention, it is both advantageous to create a nitride of chromium and that $N_2$ does not adversely affect silver during sputtering, eliminates the need for the above expensive and anti-productive alternatives because the two Ni:Cr targets may now be in the same zone as the silver target and sputtering can now be conducted in an Ar/$N_2$ atmosphere, as opposed to a pure argon atmosphere, as heretofore believed necessary. In this respect, in preferred embodiments the atmosphere employed is 50/50 by volume Ar/$N_2$, although it can range widely between 0%–75% Ar and 100%–25% $N_2$.

The Airco process teaches, as aforesaid, to sputter Si in a 100% $N_2$ environment. While this is currently one way of conducting this phase of Si sputtering according to this invention, it has also been found that under certain circumstances (e.g. small unit, low volume production), argon may be added to the $N_2$ during Si sputtering to improve, in a known way, the rate of sputtering of Si, while still forming an acceptable amount of $Si_3N_4$.

In view of the above, this invention further fulfills the above-described needs in the art by providing a novel method for making the above-described articles which includes sputter-coating the Ni:Cr/Ag/Ni:Cr targets in the same zone while employing an atmosphere containing sufficient $N_2$ to create a nitride of the Cr. Preferably, such an atmosphere contains by volume about 0%-75% Ar and about 100%-25% $N_2$. Most preferably, the volume is about 50% $N_2$ and 50% Ar. In certain embodiments the undercoat and overcoat layer sputtering is conducted in a 100% $N_2$ atmosphere, while in other embodiments argon, in amounts of about 3%-50% by volume may be used with the $N_2$ to increase productivity.

This invention will now be described with respect to certain embodiments thereof, along with reference to the accompanying illustrations, wherein:

IN THE DRAWINGS

FIG. 1 is a schematic illustration of the Airco apparatus which may be employed in the practice of this invention (and which is employed differently in the practice of the prior art as described above).

FIG. 2 is a partial side sectional view of the prior art Airco layer system.

FIG. 3 is a partial side sectional view of one embodiment of this invention.

FIG. 4 is a partial side sectional view of another embodiment of this invention.

DETAILED DESCRIPTION OF EMBODIMENTS OF THE INVENTION

Referring to FIG. 1 there is illustrated a conventional magnetron sputter coater such as the Airco device referenced above. In the practice of this invention five Zones 1-5 are preferably employed. (Layers are sequentially applied to the glass G as it progresses in the direction of arrow A.) Zone 1 contains six tubular targets $t_{1-6}$ of silicon (Si) (e.g. Si doped with 3-5% by weight Al for conductivity). Zone 2 contains six more tubular targets $t_{7-12}$ of the same material. In a similar fashion, Zones 4 and 5 each contain six more tubular targets $t_{19-24}$ and $t_{25-30}$, respectively, of the same material.

Middle Zone 3 is preferably formed of either three planar targets $P_{1-3}$ (i.e. numbered 31, 16, and 33, respectively) for making a five-layered system such as shown in FIG. 3 or five-six targets (i.e. of the tubular or planar type) for making a seven-layered system such as shown in FIG. 4. The three-planar target system as shown can, of course, also be used to make the prior art Airco layered system illustrated in FIG. 2. The target arrangement for the seven-layered system of FIG. 4 in Zone 3 is a matter of choice within the level of the skilled artisan and is not shown for convenience. Assuming the availability of six target locations as in Zones 1-2 and 4-5, as is typical of such a device, one technique to employ, given the relative thinness of the three nickel-based (e.g. nichrome) layers required, is to employ targets (31) and (33) [i.e. $P_1$ and $P_3$] as nickel-based targets and in place of target (16) [i.e. $P_2$] employ a sequence of targets between $P_1$ and $P_3$ wherein $t_{13}$ is silver, $t_{14}$ is nickel-based, and either $t_{15}$ or $t_{16}$ is silver.

In operation, the Zones 1-5 are separated by appropriate curtains "C" as are the ends, thereby to be able to establish in each zone a given, controlled atmosphere, all by conventional apparatus well known in the sputter coating art. As explained above, it was heretofore believed that when silver was employed as a target in a sputter-coating operation, it was important to maintain its zone (i.e. Zone 3) substantially free of $N_2$ as possible. Thus, in the known process for producing the prior art system of FIG. 2, 100% argon gas was specified as the atmosphere to be used. It was also believed that sputtering of Si should take place in 100% $N_2$, and thus this atmosphere was specified.

Using, then, this apparatus and atmospheres and by controlling speed and electrical power to the sputtering operation, accordingly, the known Airco process produced a layer system such as that illustrated in FIG. 2. In this FIG. 2 there is shown a glass substrate "G". Such a glass substrate was preferably a sheet of glass of about 2 mm–6 mm thick, usually made by the known float process and of a typical soda-lime-silica composition employed historically in this process. In Zones 1-2 a first undercoat layer 111 consisting essentially of $Si_3N_4$ was formed. Its nominal thickness was about 325 Å. Zones 1-2 were conducted in substantially 100% $N_2$. Next, Zone 3 was employed, using a substantially 100% argon atmosphere to first produce a relatively thick (e.g. 7 Å or greater) layer 113 of 80/20 nichrome, followed by a relatively thin (e.g. about 70 Å) rather discontinuous silver layer 115 whose discontinuity is illustrated by voids 117. In this same Zone 3 there was then applied to the silver another, relatively thick (e.g. 7 Å or greater) 80/20 nichrome layer 119. A topcoat 121 of $Si_3N_4$ was then formed in Zones 4-5 of a thickness somewhat greater than that of undercoat 111 (e.g. about 450 Å thick). The less than desirable solar management qualities of this glass are mentioned above and an example thereof is reported below under the designation "Standard [Std.] Airco".

FIG. 3 illustrates two embodiments of our invention which may be formed using the apparatus of FIG. 1. As illustrated, there are five layers formed on float glass (2 mm–6 mm thick) substrate G. First layer 211 is $Si_3N_4$ and is formed in Zones 1-2 employing a substantially 100% $N_2$ atmosphere. Optionally, under certain conditions (e.g. where sizes are smaller), some argon may be introduced, for example, into Zone 2 to increase the sputtering of Si. Next, layers 213 (213'), 215, and 219 (219') are formed in Zone 3.

In one embodiment of this invention the atmosphere employed in Zone 3 is substantially 100% argon. In this embodiment target $P_1$ (31) is preferably 80/20 nichrome, but may be nickel or other nickel-based alloy as desired. In order to obtain improved solar management characteristics and thus overcome the problems attendant the product of FIG. 2, layer 213, which is a substantially pure metallic layer, is kept to a thickness of less than about 7 Å. This is done by reducing the power to target $P_1$ (31) compared to that employed in producing the product of FIG. 2 by about 20% or more. Then, as a further improvement over the product of FIG. 2, silver layer 215 produced from target $P_2$ (16) is thickened (e.g. to about 90-105 Å) compared to that of layer 115, rendering layer 215 substantially continuous. This is accomplished conveniently by increasing the power to target $P_2$ by about 20%-33% or more compare to that used for producing layer 115.

Next, another substantially pure metallic 80/20 nichrome (or other nickel-based) layer 219 is formed in the same way as layer 213 was formed and having the same thickness thereof. This is then followed by producing in Zones 4 and 5 an overcoat layer 221 of $Si_3N_4$ in a similar way as was used to form undercoat layer 211. Layer 221 is usually somewhat thicker than layer 211, in this respect. (e.g. about 540 Å compared to about 400 Å for layer 211). While at times the thicknesses of the $Si_3N_4$ undercoat and overcoat layers (e.g. 211 and 221, or 311 and 321 described below) of this invention may be the same as those in the Airco product (e.g. 111 and 121), in the preferred embodiments of this invention, each is thickened in comparison to those of the Airco product. This is accomplished by increasing the power in the sputter coater, Zones 1–2 and 4–5, approximately 20% or more to achieve these higher thicknesses. The resulting layering system has a durability approximately the same as the layer system of the product of FIG. 2, with a bit less scratch resistance, but exhibits markedly superior emissivity, transmittance, and sheet resistance properties to this produce of FIG. 2 (i.e. transmittances approach the 80% level and emissivity and $R_s$ values are significantly lower).

In another, particularly preferred embodiment exemplified by FIG. 3, a unique method is employed, using preferably the apparatus of FIG. 1 and even better solar management properties are achieved. In this unique method the same basic steps are followed as described with respect to the first embodiment, except that, by flying directly in the face of heretofore held beliefs to the contrary, $N_2$ gas is employed with argon in Zone 3 and a nickel-chromium alloy is employed as either, and preferably both, targets $P_1$ (31) and $P_3$ (33), such that the chromium metal is deposited as a nitride thereof in the Ni:Cr layer(s) [i.e. as either or both layers 213' and/or 219']. In this respect, the argon to $N_2$ ratio may vary according to need, but, generally speaking, a ratio of 0%–75% by volume of Ar to 100%–25% $N_2$, and preferably 50%–50% Ar to $N_2$ has been found to achieve enhanced characteristics (e.g. transmittance and $R_s$) over even the first embodiment of this invention described above. In the preferred forms of this embodiment the thicknesses are maintained the same as those of the first embodiment. Typical power levels are reported below.

The layer system exemplified in FIG. 4 may be produced as above-described either by forming the nickel-based layers as substantially pure metallic layers, or by employing an $N_2$-containing argon environment and employing a nickel-chromium alloy as one or more of the targets, as above-described, achieving improved results through the creation of a nitride of chromium in one or more (and preferably all) of the Ni:Cr layers. In this embodiment, furthermore, the single silver layer 215 of FIG. 3 is split into two silver layers with a nickel-based layer therebetween. Thus, the embodiment of FIG. 4 may be produced, using the appropriate number of targets (not shown) in Zone 3, by creating in Zones 1–2 an undercoat layer 311 of $Si_3N_4$ and in Zones 4–5 an overcoat layer 321 of $Si_3N_4$. The same thicknesses for layers 311 and 321 as used for layers 211 and 221, respectively, are preferred.

FIG. 4 differs primarily from FIG. 3 in that in Zone 3 there is first produced the nickel-based (i.e. preferably 80/20 nichrome) metallic layer 313 or its nitride replacement 313' having a thickness of less than about 7 Å. Thereafter, a first layer of silver 315A of about 50 Å thick is formed, followed by another nickel-based metallic layer 314 or its nitride replacement 314' of less than about 7 Å in thickness. A second layer of silver 315B having a thickness of about 50 Å is then formed, followed by another nickel-based metallic layer 319 or its nitride replacement 319' having a thickness of less than about 7 Å. In this respect, it is to be noted that the total thickness of the combined silver layers is preferably between about 90–105 Å. The system is finished with overcoat 321 of $Si_3N_4$ as aforesaid.

As is to be expected, when in the embodiment of FIG. 4 the silver layers 315A, B are each only about 50 Å thick, discontinuities represented by voids 317 will occur, as they do in the embodiment of FIG. 2, voids 117. Such discontinuities, while a significant detriment in FIG. 2, are not in the practice of the embodiment in FIG. 4.

The seven-layer system of FIG. 4 is more durable than the prior two embodiments of FIG. 3, and while it exhibits a lower transmittance than these embodiments (i.e. just slightly above the minimal 76% level), its emissivity and $R_s$ values are better than those of the embodiments of FIG. 3. The exact reasons for this are not known, but it is believed that the severance of silver into two layers, coupled with the use of an intermediate Ni-based (e.g. Ni:Cr) layer, is believed to be substantially responsible for this. In this respect, it is believed that the intermediate Ni-based layer is a significant, functional layer which significantly helps to achieve greater durability, particularly if it is in the form of an alloy of Ni:Cr (e.g. 80/20 nichrome) wherein the chromium has been converted to a nitride thereof.

This invention will now be described with respect to certain examples as follows:

EXAMPLES

A typical standard ("STD") Airco system exemplified by FIG. 2 and the two embodiments exemplified by FIG. 3 were produced using the apparatus of FIG. 1. The first embodiment of this invention is referred to as Type "A" and the second (i.e. where a nitride is formed in both layers 213' and 219') is referred to as Type "B". The targets employed were Airco tubular aluminum doped Si targets for $t_{1-12}$ and $t_{19-30}$. Targets $P_1$ (31) and $P_3$ (33) were by weight 80% Ni and 20% Cr. Target $P_2$ (16) was silver (Ag). The glass employed was a conventional clear soda-limesilica float glass produced by Guardian Industries Corp. having a thickness of 3 mm (i.e. 0.123 inches). The line speed used was 345 inches/min. The pressure in Zones 1–2 and 4–5 was maintained at $2.5 \times 10^{-3}$ Torr. A 100% $N_2$ atmosphere was employed in these zones. In Zone 3 a pressure of $2.0 \times 10^{-3}$ Torr was maintained. For the "STD" Airco system and Type "A" of this invention a 100% argon atmosphere was employed. For Type "B" a 50%/50% argon/$N_2$ atmosphere was used. The electrical supply for each target was as follows:

TABLE 1

(Types A & B, Zones 1–2 & 4–5)

| TARGET NO. | VOLTS (V) | AMPS (A) | POWER (KW) |
|---|---|---|---|
| 1 | 470 | 124 | 58.0 |
| 2 | 481 | 115 | 55.5 |
| 3 | 431 | 21 | 8.9 |
| 4 | 446 | 123 | 55.0 |
| 5 | 446 | 124 | 55.5 |
| 6 | 449 | 124 | 55.5 |
| 7 | 440 | 123 | 54.1 |
| 8 | 449 | 130 | 58.2 |
| 9 | 429 | 123 | 52.7 |
| 10 | 420 | 123 | 51.5 |
| 11 | 479 | 30 | 14.3 |
| 12 | 450 | 112 | 50.4 |
| 19 | 425 | 136 | 57.5 |
| 20 | 444 | 135 | 60.0 |
| 21 | 453 | 129 | 50.6 |
| 22 | 426 | 130 | 55.0 |
| 23 | 415 | 104 | 43.1 |
| 24 | 441 | 135 | 59.5 |
| 25 | 458 | 35 | 16.1 |
| 26 | 477 | 138 | 65.6 |
| 27 | 455 | 133 | 60.5 |

TABLE 1-continued (Types A & B, Zones 1-2 & 4-5)

| TARGET NO. | VOLTS (V) | AMPS (A) | POWER (KW) |
|---|---|---|---|
| 28 | 478 | 137 | 58.6 |
| 29 | 447 | 86 | 38.2 |
| 30 | 429 | 86 | 36.8 |

TABLE 2

(Type "A", Zone 3)

| TARGET NO. | VOLTS (V) | AMPS (A) | POWER (KW) |
|---|---|---|---|
| 31 | 390 | 2.6 | 1.0 |
| 16 | 447 | 22.8 | 10.2 |
| 33 | 392 | 2.6 | 1.0 |

Power, Amps, and Volts must be greater for same film thickness when nitride is produced.

TABLE 3

(Type "B", Zone 3)

| TARGET NO. | VOLTS (V) | AMPS (A)* | POWER (KW)* |
|---|---|---|---|
| 31 | 403 | 5.0 | 2.0 |
| 16 | 446 | 32 | 14.2 |
| 33 | 400 | 5.1 | 2.0 |

Power, Amps, and Volts must be greater for same film thickness when nitride is produced.

TABLE 4

(STD, Zones 1-5)

| TARGET NO. | | AMPS (A) | POWER (KW) |
|---|---|---|---|
| 1 | | 80 | |
| 2 | | 80 | |
| 3 | | 80 | |
| 4 | ZONE 1 | 80 | |
| 5 | | 80 | |
| 6 | | 80 | |
| 7 | | 80 | |
| 8 | | 80 | |
| 9 | ZONE 2 | 80 | |
| 10 | | 80 | |
| 11 | | 80 | |
| 12 | | 80 | |
| 31 | | 3.8 | 1.5 |
| 16 | ZONE 3 | 18.4 | 8.1 |
| 33 | | 3.8 | 1.5 |
| 19 | | 135 | |
| 20 | | 105 | |
| 21 | | 125 | |
| 22 | ZONE 4 | 125 | |
| 23 | | 105 | |
| 24 | | 25 | |
| 25 | | 125 | |
| 26 | | 120 | |
| 27 | ZONE 5 | 50 | |
| 28 | | 110 | |
| 29 | | 110 | |
| 30 | | 80 | |

TABLE 5

(Comparative Results)

| LAYER SYSTEM | | VISIBLE TRANSMITTANCE | GLASS SIDE ($R_G$) REFLECTANCE | FILM SIDE ($R_F$) REFLECTANCE |
|---|---|---|---|---|
| Type A | Y (%) | 78.75 | 8.42 | 4.08 |
| Ill. C | x | .3097 | .2610 | .2449 |
| 2° OBS. | y | .3192 | .2722 | .2427 |
| | a* | −1.69 | −1.64 | +1.64 |
| | b* | +1.03 | −11.57 | −14.68 |
| Type B | Y | 79.57 | 7.56 | 3.75 |
| Ill. C | x | .3089 | .2641 | .2559 |
| 2° OBS. | y | .3190 | .2709 | .2441 |
| | a* | −1.98 | −0.40 | +3.77 |
| | b* | +0.84 | −11.19 | −13.45 |
| STD | Y | 76.45 | 8.26 | 5.09 |
| Ill. C | x | .3078 | .2626 | .2723 |
| 2° OBS. | y | .3163 | .2801 | .2857 |
| | a* | −1.19 | −3.25 | −1.76 |
| | b* | −0.30 | −9.88 | −6.95 |

TABLE 6

(Comparative Results)

| LAYER SYSTEM | $E_n$ | $E_h$ | $R_s$ (ohms/sq.) |
|---|---|---|---|
| Type "A" | 0.10 | 0.13 | 10.0 |
| Type "B" | 0.10 | 0.13 | 9.4 |
| STD | 0.16 | 0.20 | 15.8 |

As two other examples of this invention and in demonstration of the affect thickness of layer, particularly that of a Ni-based layer, can have upon transmittance and infrared energy reflectance, two type "B" glasses were made employing substantially identical conditions in Zones 1 and 2, and again in Zones 4 and 5 wherein, in a 100% $N_2$ atmosphere the undercoat and overcoat $Si_3N_4$ layers were formed. The targets in Zones 1, 2, 4 and 5 were Al-doped Si Targets, $P_1$ (31) and $P_3$ (33) were 80/20 nichrome and $P_2$ (16) was silver. The only difference was that in Zone 3 different power levels were employed, as reported in the following table. The glass was a 3 mm thick float glass of the soda-lime-silica type.

TABLE 7

(Zone 3, 50/50 Ar/$N_2$ Atmos.)

| TARGET (KW) | | | | | TRANSMITTANCE (Ill. C) | | |
|---|---|---|---|---|---|---|---|
| $P_1$(31) | $P_2$(16) | $P_3$(33) | $R_s$ | $E_h$ | Y % | a* | b* |
| Glass No. 1 | | | | | | | |
| 1.5 | 15.0 | 1.5 | 8.3 | 0.11 | 80.97 | −1.88 | +1.13 |
| Glass No. 2 | | | | | | | |
| 2.0 | 14.0 | 2.0 | 9.1 | 0.12 | 80.02 | −1.71 | +0.70 |

As can be seen, by slightly increasing the thickness of the two Ni:Cr (nitride) layers and slightly decreasing the thickness of the silver layer, infrared reflectance and transmittance values were decreased. Both of these glasses, however, are acceptable for commercial use in multi-pane architectural windows.

Further examples of type "A" glass were formed employing different power levels in the various zones, as reported below. The glass thickness was 3 mm and was the same standard float glass used in Table 7 above.

TABLE 8

| GLASS NO. | TARGET NO. | AMPS | KW | $R_s$ | $E_h$ | TRANSMITTANCE (Ill. C) Y % | a* | b* |
|---|---|---|---|---|---|---|---|---|
| 1 | 1-12, 19-30 | 85 | | 9.6 | 0.13 | 77.11 | −2.28 | −1.53 |
|   | 4 | 35 | | | | | | |
|   | 31 | 2.9 | 1.1 | | | | | |
|   | 16 | | 10.2 | | | | | |
|   | 33 | 2.9 | 1.1 | | | | | |
| 2 | 1-3, 5-12 | 85 | | 10.3 | 0.14 | 78.02 | −2.38 | −1.56 |
|   | 19-30 | 85 | | | | | | |
|   | 4 | 35 | | | | | | |
|   | 31 | 2.6 | 1.0 | | | | | |
|   | 16 | | 10.2 | | | | | |
|   | 33 | 2.6 | 1.0 | | | | | |
| 3 | 33 | 2.6 | 1.0 | 10.0 | 0.13 | 77.84 | −2.45 | −1.66 |
|   | 16 | | 10.4 | | | | | |
| 4 | 16 | 2.6 | 10.4 | 9.8 | 0.13 | 79.41 | −2.13 | −0.30 |
|   | 19-30 | 105 | | | | | | |
| 5 | 1-3, 5-12 | 90 | 10.4 | 9.8 | 0.13 | 79.20 | −2.10 | −0.40 |
|   | 19-30 | 90 | | | | | | |
|   | 4 | 40 | | | | | | |
| 6 | 4 | 40 | 10.4 | 9.8 | 0.13 | 79.48 | −1.95 | +0.17 |
|   | 19-30 | 115 | | | | | | |
| 7 | 1-3, 5-12 | 95 | | | | | | |
|   | 19-30 | 115 | | | | | | |
|   | 4 | 40 | | | | | | |
|   | 31, 16, 33 | | 10.4 | 9.7 | 0.12 | 79.61 | −1.89 | +0.05 |
| 8 | 31, 16, 33 | | 10.4 | 9.7 | 0.13 | 79.78 | −1.81 | +0.31 |
|   | 19-30 | 120 | | | | | | |
|   | 4 | 40 | | | | | | |
|   | 31, 16, 33 | | 10.4 | 9.8 | 0.13 | 79.95 | −1.80 | +0.15 |
| 10 | 1-3, 5-10, 12 | 105 | | 9.8 | 0.13 | 79.48 | −1.68 | +0.66 |
|   | 19-30 | 125 | | | | | | |
|   | 4 | 95 | | | | | | |
|   | 11 | 30 | | | | | | |
|   |   |   | 10.4 | | | | | |
| 11 | 11 | 30 | 10.4 | 9.7 | 0.12 | 79.66 | −1.74 | +0.62 |
| 12 | 1-2, 5-10, 12 | 107 | | 10.1 | 0.13 | 79.76 | −1.61 | +0.68 |
|   | 3, 4 | 47 | | | | | | |
|   | 11 | 32 | | | | | | |
|   | 19-30 | 125 | | | | | | |
|   | 31, 33 | | 1.0 | | | | | |
|   | 16 | | 10.2 | | | | | |
| 13* | 16 | | 10.2 | 1.0 | 9.9 | 0.13 | 79.60 | −1.62 | +0.64 |

*This glass has been found to be particularly preferred for commercial multi-pane window use.

Once given the above disclosure many other features, modifications and improvements will become apparent to the skilled artisan. Such other features, modifications and improvements are therefore considered to be a part of this invention, the scope of which is to be determined by the following claims:

We claim:

1. A sputter-coated glass article comprising a glass substrate having thereon from the glass outwardly, a layer system comprising:
   (a) an undercoat layer of $Si_3N_4$,
   (b) a layer of nickel or nichrome,
   (c) a layer of silver,
   (d) a layer of nickel or nichrome, and
   (e) an overcoat layer of $Si_3N_4$;
and, when said glass substrate has a thickness of about 2 mm–6 mm, said coated glass has a visible transmittance of at least about 78%, a normal emissivity ($E_n$) of less than about 0.12 and a hemispherical emissivity ($E_h$) of less than about 0.16.

2. A sputter-coated glass article according to claim 1 wherein said layer system consists essentially of five layers.

3. A sputter-coated glass article according to claim 1 wherein said layer system specifically consists essentially of, from the glass outwardly,
   (a) a layer of $Si_3N_4$,
   (b) a layer of nichrome,
   (c) a layer of silver,
   (d) a layer of nichrome,
   (e) a layer of silver,
   (f) a layer of nichrome, and
   (g) a layer of $Si_3N_4$.

4. A sputter-coated glass article according to claim 3 wherein each said silver layer is about 50 Å thick and each said nichrome layer is less than about 7 Å thick.

5. A sputter-coated glass article according to claim 1 wherein each said nickel or nichrome layer has a thickness less than about 7 Å and wherein there is only one silver layer and said silver layer is greater than about 90 Å thick.

6. A sputter-coated glass article according to claim 5 wherein said silver layer is about 90–105 Å thick.

7. A sputter-coated glass article according to claim 5 wherein said undercoat of $Si_3N_4$ is at least about 400 Å thick and said overcoat $Si_3N_4$ layer is at least about 540 Å thick.

8. A sputter-coated glass article according to claim 1 wherein said layer system is durable and said visible transmittance is about 78% to about 80%.

9. A sputter-coated glass article according to claim 8 wherein said $E_n$ is about 0.10 or less and said $E_h$ is about 0.13 or less.

10. A sputter-coated glass article according to claim 9 wherein said $E_n$ is about 0.09–0.10 and said $E_h$ is about 0.12–0.13.

11. A sputter-coated glass article according to claim 8 which has a sheet resistance of about 10.5 ohms/$_{sq.}$ or less.

12. A sputter-coated glass article according to claim 11 wherein said sheet resistance is about 9–10 ohms/$_{sq.}$.

13. A sputter-coated glass article comprising a glass substrate having thereon from the glass outwardly, a layer system comprising:
(a) an undercoat layer of $Si_3N_4$,
(b) a nichrome based layer selected from the group consisting of nichrome and nitrided nichrome,
(c) a layer of silver,
(d) a nichrome based layer selected from the group consisting of nichrome and nitrided nichrome, and
(e) an overcoat layer of $Si_3N_4$,
at least one said nichrome based layer being nitrided nichrome, and when said glass substrate has a thickness of about 2 mm–6 mm, said coated glass has a visible transmittance of at least about 78%, a normal emissivity ($E_n$) of less than about 0.12 and a hemispherical emissivity ($E_h$) of less than about 0.16.

14. A sputter-coated glass article according to claim 13 wherein each said nichrome based layer is said nitrided nichrome.

15. A sputter-coated glass article according to claim 13 wherein said nichrome is about 80% nickel and about 20% chromium by weight.

16. A sputter-coated glass article according to claim 15 wherein said transmittance is about 78% to about 80%, said $E_n$ is about 0.10 or less and said $E_h$ is about 0.13 or less.

17. A sputter-coated glass article according to claim 16 wherein said coated glass has a sheet resistance of about 10.5 ohms/$_{sq.}$ or less.

18. A sputter-coated glass article according to claim 17 wherein a thickness of any said nichrome based layer is less than about 7 Å thick and a total thickness of said silver is about 90–105 Å thick.

19. A sputter-coated glass article according to claim 18 wherein there is only one silver layer about 95 Å thick.

20. A sputter-coated glass article comprising a glass substrate having thereon, from the glass outwardly, a layer system comprising:
(a) an undercoat layer of $Si_3N_4$,
(b) a nichrome based layer selected from the group consisting of nichrome and nitrided nichrome,
(c) a layer of silver
(d) a nichrome based layer selected from the group consisting of nichrome and nitrided nichrome,
(e) a layer of silver,
(f) a nichrome based layer selected from the group consisting of nichrome and nitrided nichrome, and
(g) an overcoat layer of $Si_3N_4$,
each said silver layer being about 50 Å thick and at least one said nichrome based layer being nitrided nichrome, and when said glass substrate has a thickness of about 2 mm–6 mm, said coated glass has a visible transmittance greater than about 76%, a normal emissivity ($E_n$) of less than about 0.12 and a hemispherical emissivity ($E_h$) of less than about 0.16.

21. A sputter-coated glass article according to claim 20 wherein each said nichrome based layer is said nitrided nichrome and has a thickness of less than about 7 Å, a total thickness of each of said silver layer combined is about 90–105 Å, the coated glass has a sheet resistance of about 10.5 ohms/sq. or less, said nichrome is 80% nickel and 20% chromium by weight, said transmittance is about 78%–80%, said $E_n$ is about 0.10 or less and said $E_h$ is about 0.13 or less.

* * * * *